United States Patent [19]

Schade, Jr.

[11] E Re. 30,587

[45] Reissued Apr. 21, 1981

[54] DIFFERENTIAL AMPLIFIER CIRCUIT

[75] Inventor: Otto H. Schade, Jr., North Caldwell, N.J.

[73] Assignee: RCA Corporation, New York, N.Y.

[21] Appl. No.: 954,614

[22] Filed: Oct. 25, 1978

Related U.S. Patent Documents

Reissue of:

[64] Patent No.: 3,979,689
Issued: Sep. 7, 1976
Appl. No.: 545,091
Filed: Jan. 29, 1975

[51] Int. Cl.[2] ..... H03F 3/45

[52] U.S. Cl. ..... 330/257; 330/255; 330/259; 330/260; 330/261

[58] Field of Search ..... 330/252, 257, 258, 259, 330/260, 261

[56] References Cited

U.S. PATENT DOCUMENTS

| | | | |
|---|---|---|---|
| 3,541,465 | 11/1970 | Nagata et al. | 330/258 |
| 3,644,838 | 2/1972 | Graf | 330/253 |
| 3,649,926 | 3/1972 | Hill | 330/257 |
| 3,894,290 | 7/1975 | Schoeff | 330/257 |

FOREIGN PATENT DOCUMENTS

| | | |
|---|---|---|
| 2050881 | 5/1971 | Fed. Rep. of Germany . |
| 48-23368 | 3/1973 | Japan . |
| 365675 | 3/1974 | Sweden . |

*Primary Examiner*—James B. Mullins
*Attorney, Agent, or Firm*—H. Christoffersen; A. L. Limberg

[57] ABSTRACT

The transistors of a differential amplifier are coupled at their common emitter electrode connection to a low voltage power supply terminal and at their collector electrodes through respective current sinks to a point of reference potential. The collector electrodes are maintained at a voltage level above the reference potential to permit input signal swings at the base electrodes of the transistors a comparable amount below the reference voltage level. Current sources are provided for satisfying that portion of the current demand of these sinks not furnished by the transistors. When the amplifier is connected to operate as a voltage follower, additional transistors may be provided to prevent an undesirable change in the polarity of the output signal, when the input signal swings substantially below the reference voltage level.

17 Claims, 3 Drawing Figures

DIFFERENTIAL AMPLIFIER CIRCUIT

Matter enclosed in heavy brackets [ ] appears in the original patent but forms no part of this reissue specification; matter printed in italics indicates the additions made by reissue.

This application relates generally to differential amplifiers and is especially suitable for use in, but is not limited to operational transconductance amplifiers (OTA's), operated at low supply voltage levels.

Prior art integrated circuit differential amplifiers, including OTA configurations, exhibit deficiencies when operated at very low supply voltage levels, such as, for example, power supply voltage magnitudes equal to twice the forward-bias base emitter voltage ($V_{be}$) of a bipolar transistor. At such low power supply voltages, the prior amplifiers either cannot readily track input signals having amplitude ranges including the voltage of and below the negative rail, or the voltage at or above the positive rail or, if modified to permit operation in this way, lose operating speed and suffer other operating problems.

The present invention is directed to improved circuits which overcome this and a number of other prior art circuit deficiencies.

The circuits shown in the figures are preferably in integrated circuit form, but are not so limited nor is the invention limited to use in operational transconductance amplifiers.

Figure 1:
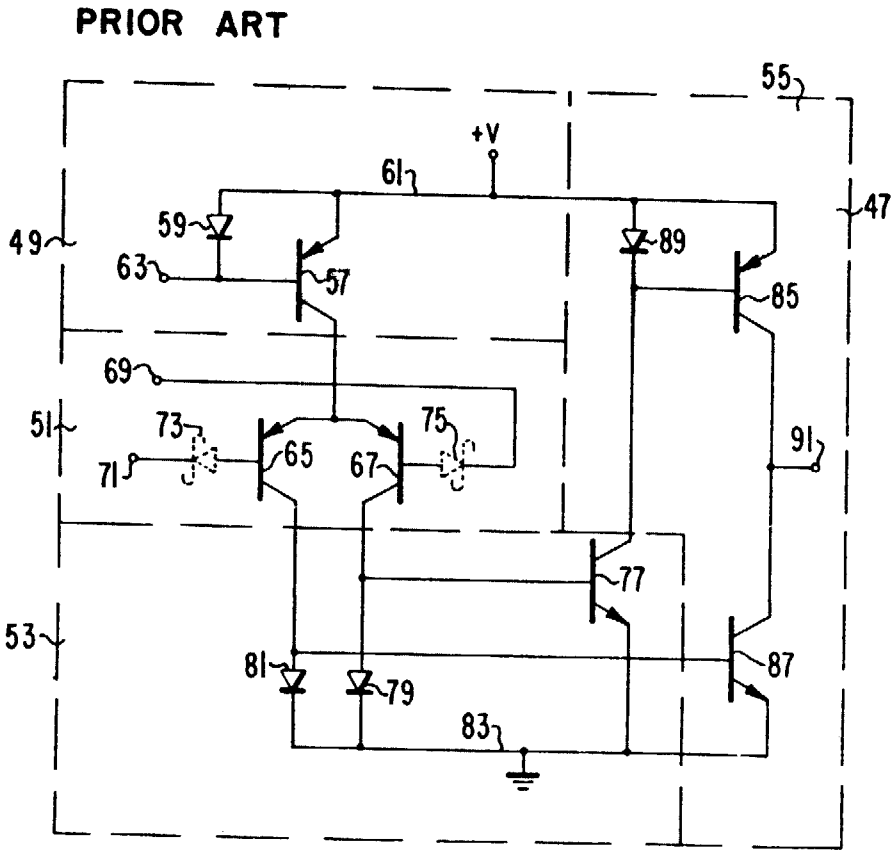
FIG. 1 is a schematic diagram of a prior art PNP transistorized differential amplifier interconnected in an operational transconductance amplifier configuration.

The prior art PNP operational transconductance amplifier (OTA) 47 of FIG. 1 includes a current source 49 to supply current to a PNP differential amplifier 51, a current sink 53, and an output stage 55.

The current source 49 is a PNP current mirror having a current bias or input terminal 63. The junction area of diode 59 is equal to the area of the base emitter junction of PNP transistor 57. Therefore, for each unit of bias current drawn from bias terminal 63, a substantially equal magnitude of current will flow through the emitter-collector current path of PNP transistor 57. The magnitude of current flowing from the current mirror to the PNP differential amplifier 51 and impedance at node 91 determine the gain of the OTA 47.

A more detailed explanation of the operation and application of operational transconductance amplifiers can be found in RCA Linear Integrated Circuit Application Note ICAN-6668, March, 1972, having the title "Applications of the CA3080 and CA3080A High-Performance Operational Transconductance Amplifiers."

If the positive rail 61 is at a voltage of +1.2 volts, and the negative rail 83 is at ground, the OTA 47 will be able to track input signals from slightly over 0 volts, to slightly less than +0.6 volts, assuming silicon diodes and transistors are used. Any input signals applied across input terminals 69 and 71 having amplitudes outside of the range given, will cause the amplifier to saturate.

While in ordinary operation, a voltage difference may be applied between the input terminals 69, 71, in the analysis which follows to show the input signal range, the same voltage is applied to both of these terminals. A similar analysis is made later of the circuit of FIG. 2. In the FIG. 3 circuit, where there is feedback to one of the input terminals, the feedback is in a sense to reduce the voltage difference between the input terminals to zero. The same type of feedback (not shown) may be employed in the circuit of FIG. 2.

If a signal at ground level is applied to both of the input terminals 69 and 71, +0.6 volts appears between the common emitter electrode connection of transistors 65 and 67, and ground, and a voltage of +0.6 volts appears across the emitter-collector path of PNP transistor 57, leaving a net voltage of zero volts across the collector-emitter electrodes of transistors 65 and 67. Therefore, transistors 65 and 67 are saturated. As a results, the OTA 47 is inoperative. Obviously, input signals having amplitudes below zero volts, cannot be tracked by OTA 47.

If +0.6 volts is applied to both input electrodes 69 and 71, this will place the common emitter electrode connection of transistors 65 and 67 +0.6 volts higher, that is, at 1.2 volts; therefore, no potential difference will exist across PNP transistor 57, causing transistor 57 to be inoperative and therefore, OTA amplifier 47 inoperative. Obviously, input signals having amplitudes greater than +0.6 volts cannot be tracked by OTA 47.

As already mentioned, in the range between these values —+0.6 volts and ground, the OTA does operate properly.

OTA 47 can be modified to permit tracking of input signals in a shifted 0.6 volt range—this one between limits of somewhat over −0.3 volts to almost +0.3 volts. The modification includes the addition of Schottky diode 73, 75, shown in phantom, in each of the base circuits of transistors 65 and 67. If an input signal having an amplitude of −10.3 volts is applied to both input terminals 69 and 71, the base electrodes of transistors 65 and 67 will be at virtual ground due to the voltage drop across the Schottky diodes (0.3 volts for this example), and a voltge of +0.6 volts will appear between the emitter electrodes of these transistors and ground. Therefore, +0.6 volt will be across the collector emitter electrodes of PNP transistor 57, and there will be insufficient voltage remaining to maintain transistors 65 and 67, and diodes 81 and 79 in conduction; therefore, the OTA 47 will be inoperative. Similar analysis will show that at and above +0.3 volt at both input terminals, the OTA becomes inoperative.

Thus, the Schottky diodes 73, 75 permit OTA 47 in track input signals at levels lower than the negative rail voltage, but the addition of the Schottky diodes causes the amplifier to lose speed or be less responsive to high frequency input signals. Also, the Schottky diodes may cause a differential offset error, if they are not identically matched as to their operating parameters.

As would be obvious to one skilled in the art, the PNP OTA 47, could readily be reconfigured as an NPN OTA and Schottky diodes employed to operate at voltages higher than the positive rail voltage (83 would in this case be the positive rail).

Figure 2:
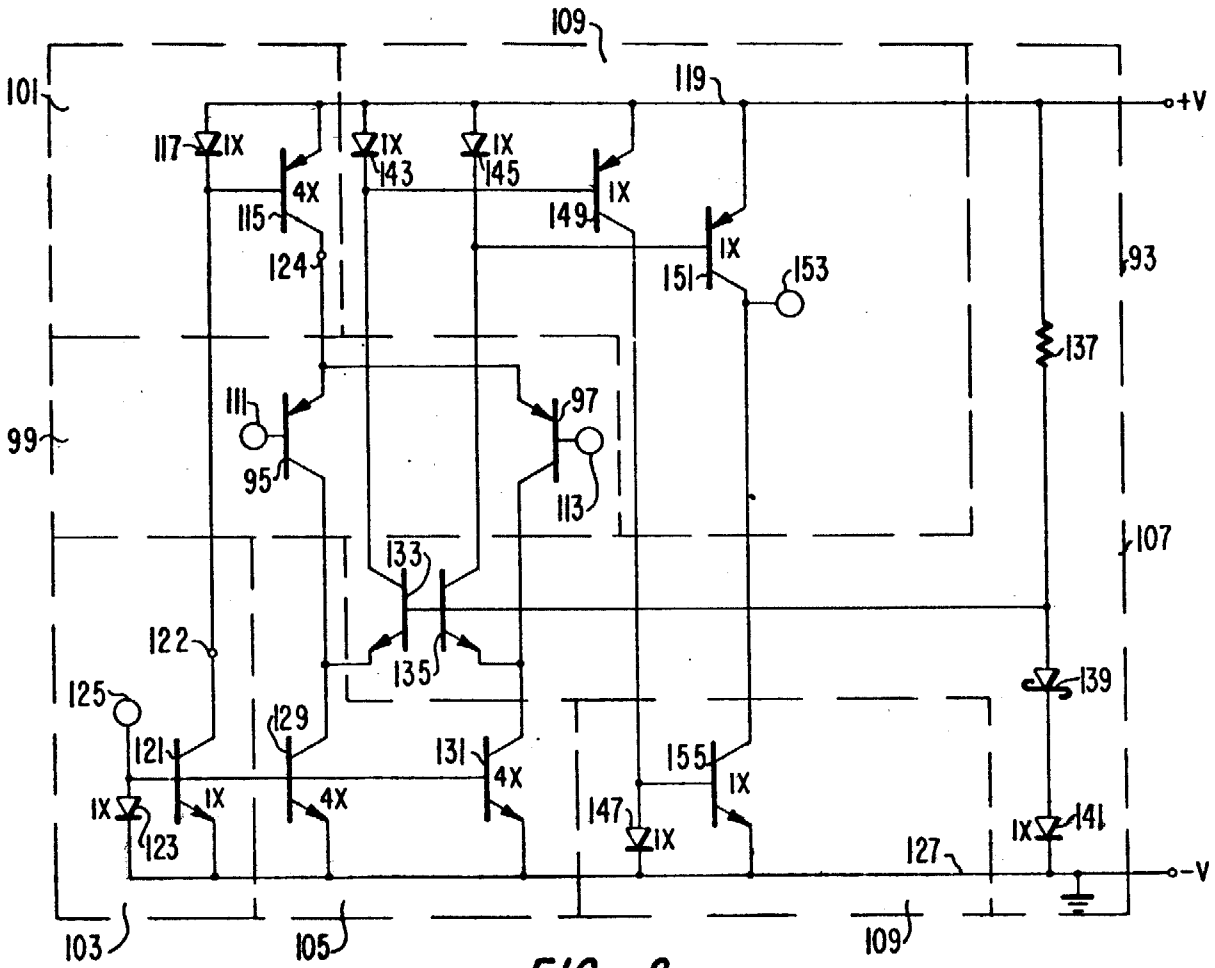
FIG. 2 is a schematic diagram of an operational transconductance amplifier embodying one form of the invention.

The embodiment of the invention shown in FIG. 2 is a low voltage PNP high-performance operational transconductance amplifier (OTA) 93. It includes a differential amplifier 99, a current source 101, a current biasing network 103, a pair of current sinks 105, a voltage biasing and current regulating network 107, and an output stage 109. Certain of the transistors have base-emitter junction areas scaled to certain of the junction areas of the diodes, such scaling is shown in FIG. 2 as 4X for four times area, and 1X for one times area.

The differential amplifier comprises a pair of PNP transistors 95, 97 having emitter electrodes connected in common to the current source 101, collector electrodes connected to a respective one of the pair of current sinks 105, and base electrodes connected to input terminals 111 and 113, respectively.

The current source 101 includes a current mirror comprising PNP transistor 115 and diode 117. The transistor is connected at its emitter electrode to a positive rail 119, at its collector electrode to the emitter electrodes of PNP transistors 95 and 97, and at its base electrode to the current biasing network 103. The base-emitter junction of PNP transistor 115 has an area that is four times that of the junction area of diode 117.

Current biasing network 103 includes a second current mirror comprising NPN transistors 121, and diode 123. The emitter electrode of transistor 121 is connected to the negative rail 127, its collector electrode is connected to the cathode of diode 117, and its base electrode is connected in common to current bias terminal 125, and the anode of diode 123. The junction area of diode 123 is equal to the base-emitter junction area of transistor 121.

The current sinks 105 comprise a pair of NPN transistors 129, 131 connected at their base electrodes to the anode electrode of diode 123, at their emitter electrodes to the negative voltage rail 127, ahd at their collector electrodes the respective collector electrodes of PNP transistors 95 and 97. The collector electrodes of NPN transistors 129 and 131 are also connected individually to the voltage biasing and current regulating network 107 via transistors 133 and 135. The base-emitter junction areas of NPN transistors 129 and 131 are four times the junction area of diode 123.

Voltage bias and current regulating network 107 includes NPN transistors 133 and 135. They connect at their emitter electrodes to the collector electrodes of NPN transistors 129 and 131, respectively, and at their collector electrodes to the output stage 109. Resistor 137 is connected between the positive voltage rail 119 and the common connection of the anode of Schottky diode 139 and the bases of transistors 133 and 135. The cathode of Schottky diode 139 is connected to the anode of diode 141; the cathode of diode 141 is connected to the negative voltage rail 127.

Diodes 143 and 145 of the output stage connect at their anode electrodes to the positive voltage rail 119, and at their cathode electrodes to the base electrodes of PNP transistors 149 and 151 respectively, and the collector electrodes of transistors 133 and 135 respectively. Transistors 149 and 151 connect at their emitter electrodes to positive rail 119 and at their collector electrodes to the base and collector electrodes, respectively, of transistors 155. The diode 147 connected between the base and emitter electrodes of the latter transistor forms a current mirror with this transistor, which is connected at its common terminal to rail 127. As indicated in the drawing, the junction areas of the diode and transistor are in 1 to 1 ratio. The circuit output terminal 153 is at the common collector electrode connection of transistors 151 and 155.

In the operation of the circuit of FIG. 2 a current bias is applied to terminal 125. Since the junction areas of diode 123 and PNP transistor 121 are equal, the current flowing into the output terminal 122 of the mirror (121, 123) will equal that flowing through diode 123. This same current flows through diode 117, and in view of the geometry of mirror (117, 115), four times this current flows from the output terminal 124 of the latter mirror.

The pair of current sinks 105, includes NPN transistors 129 and 131, each one of which forms a current mirror with diode 123, and each one of which has a base-emitter junction area scaled to be four times the area of the junction of the diode 123. Therefore, for each unit of current flowing through diode 123, NPN transistors 129 and 131 will each demand as current sinks, four units of current through their collector-emitter electrodes to the negative rail.

If one assumes that a signal at ground level is applied to both input terminals 111 and 113 of the differential amplifier 99, then the four units of current supplied to the commonly connected emitter electrodes of transistors 95 and 97 from current source 101 will split equally between these electrodes. Two of the units will flow through the emitter-collector path of transistor 95 to sink 129, and the other two units will flow through the corresponding path of transistor 97 to sink 131. At this time, NPN transistors 129 and 131 are each demanding four units of current, but are each receiving only two units of current via pair 99.

The NPN transistors 133 and 135 of the voltage biasing and current regulating network 107 meet the additional current demands of the NPN transistors 129 and 131. These transistors 133 and 135 are biased into conduction by the +0.9 volts drop across the series circuit including Schottky diode 139 and diode 141, and conduct two units of current each to NPN transistors 129 and 131. The 0.6 volt base-emitter offset voltage of transistors 133 and 135, when substracted from the 0.9 volt bias voltage, causes a +0.3 volts level to be present at the collector electrodes of NPN transistors 129 and 131. This insures that transistors 129 and 131 do not saturate over the input signal amplitude range of interest.

The input common-mode range of the amplifier of FIG. 2 is roughly 0.9 volts. At one end of the range, with −0.3 volts at both input electrodes, the common emitter connection of transistors 95 and 97 is at +0.3 volts, and the emitters of transistors 133 and 135 also are at +0.3 volt. This cuts off transistors 95 and 97, as their collector and emitter potentials are the same +0.3 volt. At +0.6 volt at both input electrodes, transistor 115 cuts off, as its emitter and collector electrodes are both at +1.2 volts. This range of from slightly over −0.3 volts to slightly under +0.6 volts is greater than that of the prior art amplifier of FIG. 1 and, of course, extends below the negative rail voltage level of zero volts. The OTA 93 linearly tracks input signals over this entire range.

Output stage 109 provides Class A amplification of the output signals developed across the collector electrodes of NPN transistors 133 and 135. Output stage 109 also provides a single-ended output signal at output terminal 153.

OTA 93 need not be restricted to a positive rail voltage of +1.2 volts. Positive rail voltages in excess of +36 volts can be utilized. Also, the currents can be approportioned in other than the ratios given. The OTA amplifier 93 will operate with unbalanced input signals, as well as balanced input signals, over its range of input signal amplitude tracking. Obviously, if the positive rail voltage is increased above +1.2 volts, or the negative rail is connected to a negative voltage, the input common mode range of the amplifier will be extended.

The OTA 93 can also operate with a voltage across the rails 119 and 127 as low as $IV_{be} + V_{SAT.}$ (voltage across collector-emitter electrodes during saturation), which might typically total 0.8 volt, depending upon the geometry, size, material, etc, of the transistors used therein. With lower power supply voltage levels, the input common-mode range of the amplifier will be contracted.

The OTA 93 retains the current-scale features of the classical OTA configurations, and practical temperature excursions are feasible. The high-frequency response of the amplifier 93 is not impaired by, nor are offset voltages added by, the addition of the first embodiment of the invention to the OTA amplifier circuit. The complement, or NPN OTA amplifier configuration of OTA amplifier 93 is also practical.

Figure 3:
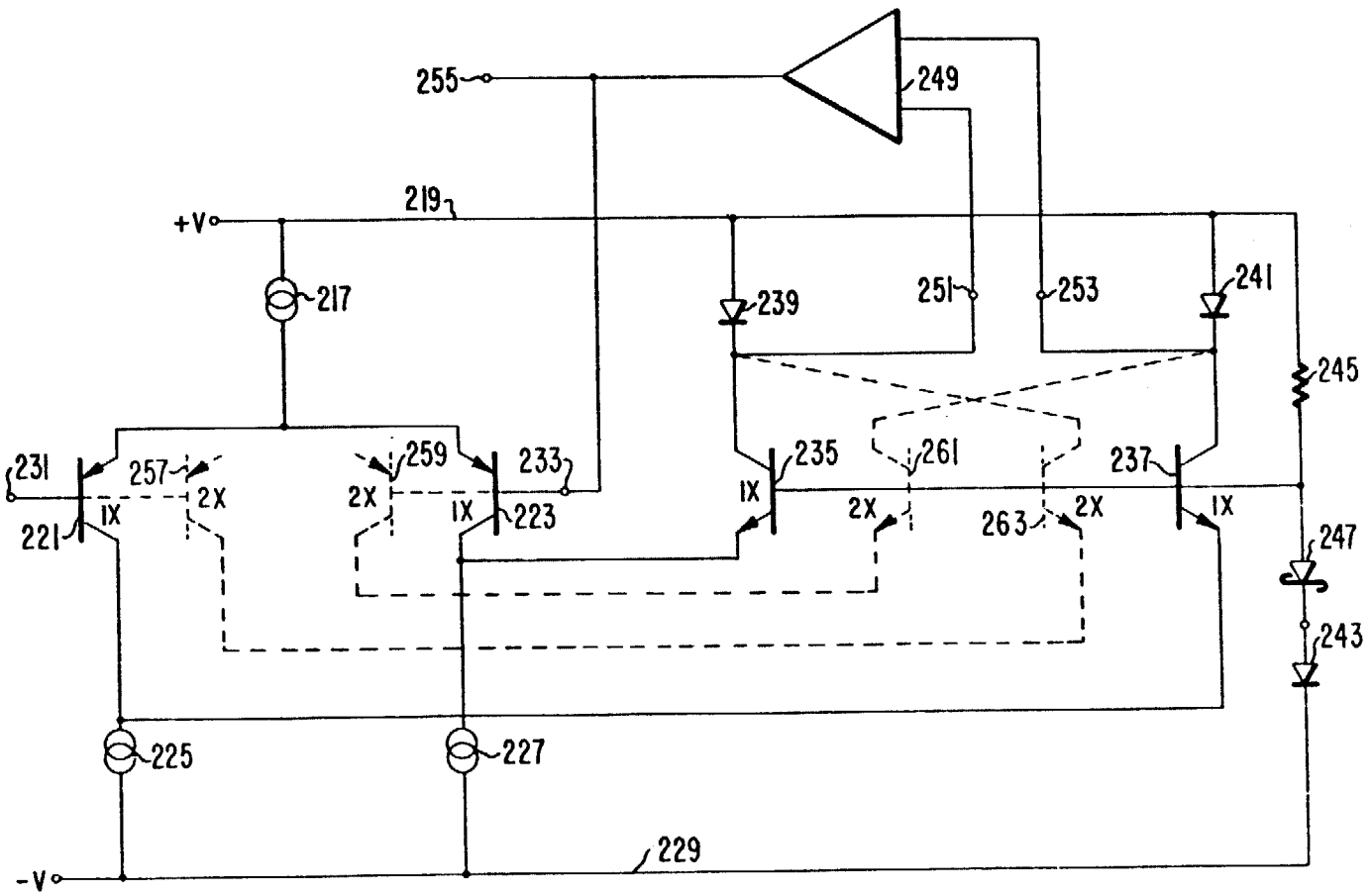
FIG. 3 is a simplified schematic diagram of a feedback operational amplifier embodying a second form of the invention.

The circuit shown in FIG. 3 includes a solid line portion and a dashed line or phantom portion. The solid line portion does not includes the current bias terminal of the FIG. 2 circuit, and does add a feedback amplifier 249, but in other respects is generally similar, in principle of operation, to the FIG. 2 circuit. This solid line circuit can operate as is. However, when modified to include the phantom portion of the circuit, the performance of the FIG. 3 circuit is considerably improved, as discussed in detail later.

The embodiment of FIG. 3 includes a current source 217 connected between a positive rail 219, and the commonly connected emitter electrodes of PNP transistors 221 and 223. A pair of current sinks 225 and 227, are connected from the negative voltage rail 229 to the collector electrodes of PNP transistors 221 and 223, respectively. The input terminals 231, 233 are at the base electrodes of NPN transistors 221 and 223, respectively.

The solid line portion of FIG. 3 includes a pair of NPN transistors 235, 237, two diodes 239, 241, a resistor 245, a Schottky diode 247, and a conventional diode 243. The resistor 245, and diodes 247 and 243 are connected in series between the two rails 219 and 229, in the same manner as the comparable elements of FIG. 2. The base electrodes of NPN transistors 235 and 237 connect to the connection point between resistor 245 and the anode of Schottky diode 247, their emitter electrodes connect to the collector electrodes of PNP transistors 223 and 221, respectively, and their collector electrodes connect to the cathode of diodes 239 and 241, respectively. The anodes of the diodes 239 and 241 connect to the positive rail 219. The collector electrodes of NPN transistors 235 and 237 also connect to output stage 249 whose output terminal 255 connects to input terminal 233.

The dashed line portion of the circuit includes a pair of PNP transistors 257 and 259, and a pair of NPN transistors 261 and 263. The base electrodes of PNP transistors 257 and 259 connect to the base electrodes of PNP transistors 221 and 223, respectively; their collector electrodes connect to the emitter electrodes of NPN transistor 263 and 261, respectively; and their emitter electrodes are shown floating or unconnected, for only their collector-base junctions are required, as will be explained. The base electrodes of NPN transistors 261 and 263 connect to the anode electrode of Schottky diode 247, and their collector electrodes are cross-connected to the collector electrodes of NPN transistors 237 and 235, respectively.

In the operation of the solid line portion of the voltage-follower circuit of FIG. 3, the voltage developed between output terminal 255 and the negative rail has an amplitude equal to the amplitude of the input signal applied to the input terminal 231. The feedback signal from the output terminal 255 to input terminal 233 causes the amplifier to regulate itself for a substantially zero differential input voltage, but such regulation can only be maintained over a limited range of amplitudes of the input signal. For the output stage of the amplifier 249, this amplitude range is usually limited to no closer than $V_{SAT.}$ (saturation voltage of amplifier 249) to either the positive rail 219 or the negative rail 229. In other words, the follower mode of operation will normally be maintained for input signals having amplitudes less than the positive rail 219 voltage +V minus $V_{SAT}$, and greater than the negative rail 229 voltage −V plus $V_{SAT}$.

Assume that the positive rail 219 is connected to a voltage source of +1.2 volts, and that the negative rail 229, is connected to ground. In the follower mode of operation, the input voltage can attain an amplitude below the negative rail 229 approaching −0.3 volts, when the bias voltage applied to the base electrodes of NPN transistors 235 and 237 is +0.9 volts (as was the case with the PNP OTA of FIG. 2). Such an input voltage amplitude excursion can cause undesirable effects in the operation of the follower configured amplifier.

For example, assume that the amplitude of the input voltage is decreasing from a positive level toward ground, and that the output voltage at terminal 255 tracks accordingly. When the input signal falls below zero volts or the negative rail 229, amplifier 249 having attained its minimum amplitude output voltage at zero volt input signal, will saturate in a "low" or 0 output state. When this condition occurs, PNP transistor 221 is placed into a high conduction state by the negative voltage at its base, whereas PNP transistor 223 is starved for current because of both the higher voltage at its base and the correspondingly higher conduction state of PNP transistor 221. Accordingly, NPN transistor 235 is in a high conductivity state to satisfy the current demand of current sink 227, and NPN transistor 237 is non-conductive, because of PNP transistor 221 supplying all of the current demands of current sink 225. Also, diode 239 is conducting a high magnitude of current, whereas diode 241 is nonconductive.

In the voltage follower mode of operation, as the amplitude of the input signal falls below the voltage level of the negative rail 229, it is desirable to maintain the zero amplitude or "low" polarity of the output signal from the now saturated output stage 249, the aforementioned state of the amplifier for an input signal below the negative rail 229. This is not possible when the amplitude of the input signal falls below about −0.3 volt, at which point the collector-base electrode junction of PNP transistor 221 becomes sufficiently forward-biased to conduct significant current. If the source impedance of the input signal is low, a high magnitude of current will flow through the current path including diode 241, the collector-emitter electrodes of transistor 237, the collector-base electrodes of transistor 221, and the Source impedance of the input signal Diode 241 has gone from a nonconductive to a relatively highly conductive state, and may be conducting a higher magnitude of current than diode 239. If this occurs, output stage 249 will be toggled to change its output from a "low" to a "high" state. In other words, output stage 249 changes its output state because of the relative change in amplitude of the input signals connected to input terminals 251 and 253 of the output stage 249, the amplitude of voltage at input terminal 253 now being less than the amplitude of the voltage at terminal 251.

The change in state in the output signal from output stage 249 is highly undesirable. The portion of the circuit, including transistors 257, 259, 261, and 263, shown in phantom, prevents this undesirable change in the output stage of the amplifier in a follower mode of operation. The junction areas of transistors 257, 259, and 261, and 263, are made substantially larger than (twice in this example) the junction areas of the other transistors 221, 223, 235, 237, as indicated by the legends X, 2X in the drawing.

When the amplitude of the input signal is substantially greater than −0.3 volt, the overdrive transistors 257, 259, 261, 263 are inoperative. When the amplitude of the input signal is about −0.3 volt, the amplifier will go into the overdrive state. In this state, transistors 263 and 257 will become conductive, and will draw twice the magnitude of current through diode 239 to the source impedance of the input signal, as is being drawn through diode 241, transistor 237, and transistor 221, to the source impedance of the input signal. The difference in the magnitudes of the overdrive current is due, in this example, to the junction areas of transistors 263 and 257, being twice the junction areas of transistors 237 and 221. Accordingly, the amplitude of the voltage at input terminal 251 will remain less than the amplitude of the voltage at input terminal 253, maintaining the desired output state of the output state 249, during the overdrive condition.

Although, for the example given, the overdrive protection circuit need only transistors 263 and 257, transistors 261 and 259 are also included. The reason for this is that output amplifier stage 249 may be either noninverting or inverting, which permits the output signal to be connected to either one of the input terminals 231 or 233, to provide the follower mode of operation. The input signal to the amplifier would be connected to the unconnected input terminal 231 or 233. Therefore, it follows that the overdrive protection circuit should be provided for each side of the amplifier.

While not shown, the dashed circuit of FIG. 3 can be incorporated into the OTA 93, to provide overdrive protection when OTA 93 is connected as a voltage follower. OTA 93 can be readily interconnected as a voltage follower by connecting the output terminal 153 to one of the signal input terminals 111, 113, and connecting the input signal to the other input terminal 111, 113.

What is claimed is:

1. An amplifier comprising:

a pair of input terminals receptive of input signals;

first and second like conductivity transistors each having collector, emitter and base electrodes, said emitter electrodes being connected to one another, and each base electrode being connected to a different input terminal;

first and second voltage rails;

first current supply means connected between the emitter electrodes of said first and second transistors and said first voltage rail, for providing a current flow of given value between said emitter electrodes and said first rail;

second and third current supply means connected between the collector electrodes of said first and second transistors and said second voltage rail, respectively, which together provide a flow of current substantially greater than that of said first current supply means;

fourth and fifth current supply means, the fourth connected between said first rail and said second supply means, the fifth connected between said first rail and said third supply means, said fourth current supply means and said first transistor supplying a total current equal to that of said second supply means, and said fifth current supply means and second transistor supplying a total current equal to that of said third supply means; and means for maintaining said collector electrodes at [a reference voltage level of a value between that at said first and second rails] *quiescent potentials of like value departing from the voltage on said second voltage rail in the same direction as the voltage on said first voltage rail and by an amount sufficiently small that the base electrode of either of said first and second transistors can accept input voltages with excursions past the voltage on said second voltage rail in the direction away from the voltage on said first voltage rail without appreciable forward conduction of current between the base electrode of that transistor and its collector electrode.*

2. The amplifier or claim 1, further including means for concurrently adjusting the current flow of said first, second, and third current supply means.

3. The amplifier of claim 1, wherein said maintaining means includes:

said fouth and fifth current supply means each including third and fourth transistors, each opposite in conductivity to said first transistor, each having a collector electrode individually coupled to said first rail, an emitter electrode individually connected to the collector electrode of said first and second transistors, respectively, and a base electrode; and means for supplying a predetermined operating voltage in common to the base electrodes of said third and fourth transistors.

4. The amplifier of claim 2, wherein said first current supply means includes:

a first current mirror having a common terminal connected to said first voltage rail, an output terminal connected to the emitter electrodes of said first and second transistors, and an input terminal; and said concurrent adjusting means including a second current mirror having a common terminal connected to said second rail, an input terminal receptive of a current bias signal, and an output terminal connected to said input terminal of said first current mirror.

5. The amplifier of claim 2, wherein said second and third current supply means include:

said concurrent adjusting means including a first current mirror having an input terminal receptive of a current bias signal, and a common terminal connected to said second voltage rail; and third and fouth transistors each having opposite conductivity as said first transistor, a collector electrode individually connected to the collector electrodes of said first and second transistors, respectively, and a base electrode connected in common to said input terminal of said first current mirror, the combination providing second and third current mirrors, respectively.

6. The amplifier of claim 3, wherein said means for supplying a predetermined operating voltge to said third and fourth transistors includes:

a pair of diodes coupled in series between said first and second rails, one of said diodes being a Schottky diode, one of said diodes having an electrode connected in common to the base electrodes of said third and fourth transistors.

7. The amplifier of claim 3, which further includes:

an output terminal, whereby an ouptut signal is developed across said output terminal and said second rail;

a feedback path from said output terminal to one of said pair of input terminals, for placing said amplifier in a voltage follower mode of operation, whereby whenever an input signal connected to the other input terminal has a like polarity as, and an amplitude substantially exceeding, a voltage at said second voltage rail, said amplifier tends to undesirably change the polarity of said output signal; and means responsive to said input signal for preventing said undesirable change of polarity of said output signal.

8. The amplifier of claim 7, wherein said means for preventing said undesirable change of polarity of said output signal includes:

fifth and sixth transistors, each being of the same conductivity as said first transistor, each having a base electrode individually connected to the pair of input terminals, respectively, each having an unconnected emitter electrode, and a collector electrode; and seventh and eight transistors each being opposite in conductivity to said first transistor, each having a base electrode connected in common to said operating voltage supply means, said seventh transistor having an emitter electrode connected to the collector electrode of said sixth transistor, and a collector electrode connected to the collector electrode of said fourth transistor, said eighth transistor having an emitter electrode connected to the collector electrode of said fifth transistor, and a collector electrode connected to the collector electrode of said third transistor.

9. A differential amplifier comprising, in combination:

first and second terminals across which an operating voltage may be applied;

first and second transistors, each having base, emitter and collector electrodes, connected to one another at their emitter electrodes;

two signal input terminals, one coupled to each base electrode;

a current source, and first and second current sinks, said source coupling said emitter electrodes to said first terminal, said first current sink coupling one of said collector electrodes to said second terminal, and said second current sink coupling the other of said collector electrodes to said second terminal, said two current sinks demanding together a total current which is substantially more than is available from said current source;

means coupled to said collector electrodes for maintaining said collector electrodes at [a voltage level] *respective quiescent voltage levels* between that at said first terminal and that at said second terminal, *departing from the voltage level at said second terminal by an amount sufficiently small that the base electrode of either of said first and second transistors can accept input voltages with excursions past the level at said second terminal in the direction away from the voltage level at said first terminal without appreciable forward conduction of current between the base electrode of that transistor and its collector electrode;* and means coupled to said collector electrodes for supplying the additional current demanded by said two current sinks.

10. A differential amplifier as set forth in claim 9, wherein said means for maintaining said collector electrodes at a voltage level comprises a reference voltage source and two semiconductor junctions, one connected in the forward direction between said reference voltage source and one collector electrode, and the other connected in the forward direction between said reference voltage source and the other collector electrode.

11. A differential amplifier as set forth in claim 10, wherein said means for supplying the additional current comprises second and third current sources, each including a transistor having base, emitter and collector electrodes, and both of different conductivity type than said first and second transistors, one connected at its emitter electrode to the collector electrode of said first transistor and the other connected at its emitter electrode to the collector electrode of the second transistor, both connected at their base electrodes to said reference voltage source, and both coupled at their collector electrodes to said first terminal, said semiconductor junctions comprising the base-emitter junctions of said transistors of said second and third current source.

12. A differential amplifier as set forth in claim 11, wherein said reference voltage source comprises:

a direct current impedance means connected at one terminal to said first terminal; and a pair of diodes connected in series in the forward direction between the other terminal of said impedance means and said second terminal, one of said diodes comprising a Schottky diode.

13. A differential amplifier as set forth in claim 11, further including:

an output terminal individually coupled to the collector electrodes of the transistors of said second and third current source, for providing an output signal reference to the voltage at said second terminal;

a feedback path between said output terminal and one of said input terminals for supplying to said one input terminal a signal of the same amplitude as the input signal applied to the other input terminal; and means responsive to said input signal for preventing an undesirable tendency of said amplifier to reverse the polarity of said output signal, whenever the amplitude of the input signal substantially exceeds the amplitude of a voltage at said second terminal.

14. A differential amplifier as set forth in claim 13, wherein said means for preventing said undesirable change of polarity of said output signal includes:

third and fourth transistors, each being of the same conductivity as said first transistor, each having a base electrode connected to an individual one of said two signal input terminals, respectively, each having an unconnected emitter electrode, and a collector electrode; and fifth and sixth transistors each being opposite in conductivity to said first transistor, each having a base electrode connected in common to said reference voltage source, said fifth transistor having an emitter electrode connected to the collector electrode of said fourth transistor, said sixth transistor having an emitter electrode connected to the collector electrode of said third transistor;

the transistors of said second and third current sources each having a collector electrode individually connected to the collector electrodes of said sixth and fifth transistors, respectively.

*15. An amplifier comprising:*

*a pair of input terminals receptive of input signals;*

*first and second like-conductivity transistors each having collector, emitter and base electrodes, said emitter electrodes being connected to one another, and each base electrode being connected to a different input terminal;*

*first and second voltage rails;*

*first current supply means connected between the emitter electrodes of said first and second transistors and said first voltage rail, for providing a current flow of given value between said emitter electrodes and said first rail;*

*first current mirror amplifier means being connected within said first current supply means, having an input connection, having at least a first output connection to the emitter electrodes of said first and second transistors, and having a common connection to said first voltage rail;*

*second and third current supply means connected between the collector electrodes of said first and second transistors and said second voltage rail, respectively, which together provide a flow of current substantially greater than that of said first current supply means;*

*second current mirror amplifier means being connected within said second and third current supply means, having an input connection, having at least first and second output connections, which first and second ouptut connections are respectively to the collector electrode of said first transistor and to the collector electrode of said second transistor, and having a common connection to said second voltage rail;*

*fourth and fifth current supply means, the fourth connected between said first rail and said second supply means, the fifth connected between said first rail and said third supply means, said fourth current supply means and said first transistor supplying a total current equal to that of said second supply means, and said fifth current supply means and second trasistor supplying a total current equal to that of said third supply means; and*

*means for maintaining said collector electrodes at a reference voltage level of a value between that at the first and second rails; and*

*means for concurrently adjusting the current flow of said first, second, and third current supply means including*

*means for applying a control current to the input connection of one of said first and second current mirror amplifier means and*

*means for connecting a further output connection of said one of said first and second current mirror amplifier means to the input connection of the other of said first and second current mirror amplifer means.*

16. The amplifier of claim 15 wherein said maintaining means includes:

*said fourth and fifth current supply means each including third and fourth transistors, each opposite in conductivity to said first transistor, each having a collector electrode individually coupled to said first rail, an emitter electrode individually connected to the collector electrode of said first and second transistors, respectively, and a base electrode; and*

*means for supplying a predetermined operating voltage in common to the base electrodes of said third and fourth transistors.*

*17. The amplifier of claim 16 with means for converting the collector currents of said third and fourth transistors to single ended form, which means includes:*

*an output terminal for signals for which the collector electrode of said third transistor is direct coupled, and*

*third current mirror amplifier means having an input connection to which the collector electrode of said fourth transistor is direct coupled, and having an output connection to said output terminal.*

* * * * *

UNITED STATES PATENT AND TRADEMARK OFFICE

CERTIFICATE OF CORRECTION

PATENT NO. : Re. 30,587

DATED : April 21, 1981

INVENTOR(S) : Otto Heinrich Schade, Jr.

It is certified that error appears in the above—identified patent and that said Letters Patent is hereby corrected as shown below:

| | | |
|---|---|---|
| Col. 2, Line 41 | - | "-10.3" should be -- -0.3 -- ; |
| Col. 2, Line 54 | - | "in" should be -- to -- ; |
| Col. 5, Line 9 | - | "$IV_{be}$" should be -- $1V_{be}$ -- ; |
| Col. 5, Line 26 | - | "includes" should be -- include -- ; and |
| Col. 7, Line 1 | - | after "signal" add a period -- . -- . |
| Col. 8, Line 35 | - | "or claim 1" should be -- of claim 1 -- ; |

UNITED STATES PATENT AND TRADEMARK OFFICE

CERTIFICATE OF CORRECTION

PATENT NO. : Re. 30,587

DATED : April 21, 1981

INVENTOR(S) : Otto Heinrich Schade, Jr.

It is certified that error appears in the above—identified patent and that said Letters Patent is hereby corrected as shown below:

| | | |
|---|---|---|
| Col. 10, Line 42 | - | "source" should be -- sources -- |
| Col. 10, Line 55 | - | "source" should be -- sources -- ; |
| Col. 10, Line 56 | - | "reference" should be -- referenced -- ; |
| Col. 12, Line 10 | - | "trasistor" should be -- transistor -- ; and |
| Col. 12, Lines 26 & 27 | - | lines 26 and 27 should be in italics. |

Signed and Sealed this

*First* Day of *December 1981*

[SEAL]

*Attest:*

*Attesting Officer*

GERALD J. MOSSINGHOFF

*Commissioner of Patents and Trademarks*